United States Patent
Mishima et al.

(10) Patent No.: US 11,211,519 B2
(45) Date of Patent: Dec. 28, 2021

(54) METHOD FOR MANUFACTURING SOLAR CELL

(71) Applicant: KANEKA CORPORATION, Osaka (JP)

(72) Inventors: Ryota Mishima, Osaka (JP); Kunihiro Nakano, Osaka (JP); Katsunori Konishi, Osaka (JP); Daisuke Adachi, Osaka (JP); Takashi Kuchiyama, Osaka (JP); Kenji Yamamoto, Osaka (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 17/000,226

(22) Filed: Aug. 21, 2020

(65) Prior Publication Data

US 2020/0411713 A1 Dec. 31, 2020

Related U.S. Application Data

(63) Continuation of application No. PCT/JP2019/005407, filed on Feb. 14, 2019.

(30) Foreign Application Priority Data

Feb. 23, 2018 (JP) .............................. JP2018-030758

(51) Int. Cl.
*H01L 31/20* (2006.01)
*H01L 31/0236* (2006.01)
(Continued)

(52) U.S. Cl.
CPC ...... *H01L 31/202* (2013.01); *H01L 31/02363* (2013.01); *H01L 31/0747* (2013.01); *H01L 31/1804* (2013.01)

(58) Field of Classification Search
CPC ............. H01L 31/202; H01L 31/02363; H01L 31/0747; H01L 31/0745; H01L 31/1804; Y02E 10/547; Y02P 70/50
See application file for complete search history.

(56) References Cited

U.S. PATENT DOCUMENTS

2005/0062041 A1* 3/2005 Terakawa ............ H01L 31/0747
257/53
2015/0179838 A1* 6/2015 Rim ................ H01L 31/022441
136/256
(Continued)

FOREIGN PATENT DOCUMENTS

CN 103329281 A * 9/2013 ......... H01L 31/0445
JP 2002134510 A 5/2002
(Continued)

OTHER PUBLICATIONS

English translation of written opinion for parent application PCT/JP2019/005407 dated Aug. 27, 2020 (Year: 2020).*

*Primary Examiner* — Earl N Taylor
(74) *Attorney, Agent, or Firm* — Alleman Hall Creasman & Tuttle LLP

(57) ABSTRACT

The method for manufacturing a solar cell includes: forming a first semiconductor layer of first conductivity type on a surface of a semiconductor substrate; forming a lift-off layer containing a silicon-based material on the first semiconductor layer; selectively removing the lift-off layer and first semiconductor layer; forming a second semiconductor layer of second conductivity type on a surface having the lift-off layer and first semiconductor layer; and removing the second semiconductor layer covering the lift-off layer by removing the lift-off layer using an etching solution. The linear expansion coefficients of the semiconductor substrate and the lift-off layer satisfy the relational expression: the linear expansion coefficient of the lift-off layer <the linear (Continued)

expansion coefficient of the semiconductor substrate, and the forming of the second semiconductor layer or the removing of the second semiconductor layer is performed at a temperature higher than the temperature in the forming of the lift-off layer.

3 Claims, 4 Drawing Sheets

(51) Int. Cl.
*H01L 31/0747* (2012.01)
*H01L 31/18* (2006.01)

(56) References Cited

U.S. PATENT DOCUMENTS

| | | | |
|---|---|---|---|
| 2015/0214396 A1* | 7/2015 | Lee | H01L 31/0745 136/249 |
| 2016/0268458 A1* | 9/2016 | Kimoto | H01L 31/0747 |
| 2018/0033904 A1* | 2/2018 | Adachi | H01L 31/02363 |
| 2019/0123221 A1* | 4/2019 | Konishi | H01L 31/022441 |
| 2020/0411713 A1* | 12/2020 | Mishima | H01L 31/02363 |

FOREIGN PATENT DOCUMENTS

| | | | | |
|---|---|---|---|---|
| JP | 2009200267 A | | 9/2009 | |
| JP | 2015142132 A | | 8/2015 | |
| WO | WO-2013077038 A1 | * | 5/2013 | ..... H01L 31/022475 |
| WO | 2015060432 A1 | | 4/2015 | |
| WO | WO-2015064634 A1 | * | 5/2015 | ..... H01L 31/022466 |
| WO | 2017217219 A1 | | 12/2017 | |
| WO | WO-2019138613 A1 | * | 7/2019 | ......... H01L 31/0224 |
| WO | WO-2019163646 A1 | * | 8/2019 | ......... H01L 31/0747 |
| WO | WO-2019163647 A1 | * | 8/2019 | ......... H01L 31/1804 |
| WO | WO-2019163648 A1 | * | 8/2019 | ......... H01L 31/0747 |

* cited by examiner

METHOD FOR MANUFACTURING SOLAR CELL

CROSS-REFERENCE TO RELATED APPLICATION

This is a continuation of PCT International Application No. PCT/JP2019/005407, which was filed on Feb. 14, 2019, and which claims priority to Japanese Patent Application Ser. No. 2018-030758 filed on Feb. 23, 2018, the entire disclosures of each of which are herein incorporated by reference for all purpose.

BACKGROUND

The present invention relates to a method for manufacturing a solar cell.

A double-sided electrode type solar cell in which the respective electrodes are disposed on both surfaces (a light-receiving surface and a back surface) of a semiconductor substrate has been commonly used as a solar cell. In recent years, a back-contact (back-electrode) type solar cell in which an electrode is disposed only on the back surface as shown in Japanese Unexamined Patent Publication No. 2009-200267 (hereinafter referred to as Patent Document 1) has been developed as a solar cell without shadow loss caused by the electrode.

SUMMARY

However, in the back-contact type solar cell, a p-type semiconductor layer and an n-type semiconductor layer have to be electrically isolated on the back surface which is smaller in area than the double-sided electrode type solar cell. In Patent Document 1, the p-type semiconductor layer and the n-type semiconductor layer are electrically isolated using a laser beam. Therefore, the back-contact type solar cell involves a problem in that the manufacturing is more complicated than that of a double-sided electrode type solar cell, for example.

Further, if the p-type semiconductor layer and the n-type semiconductor layer are electrically isolated using a laser beam in a complicated manner, electrically isolation may not be performed sufficiently due to lack of accuracy of irradiation with the laser beam or lack of output power of the laser beam. This case involves a problem in reduction of the performance of the back-contact type solar cell. In particular, formation of the p-type semiconductor layer and the n-type semiconductor layer on a semiconductor substrate having a texture shape increases the risk of the reduction in performance.

The present invention has been made in order to solve the above-mentioned problems and is intended to easily manufacture a high-performance, back-contact type solar cell.

In order to achieve the aforementioned object, a first aspect of the present invention is directed to a method for manufacturing a solar cell. The method includes: forming a first semiconductor layer of a first conductivity type on one of two major surfaces of a semiconductor substrate, the two major surfaces facing each other; forming a lift-off layer containing a silicon-based thin film material on the first semiconductor layer; selectively removing the lift-off layer and first semiconductor layer; forming a second semiconductor layer of a second conductivity type on the major surface having the lift-off layer and the first semiconductor layer; and removing the second semiconductor layer covering the lift-off layer by removing the lift-off layer using an etching solution. The linear expansion coefficients of the semiconductor substrate and the lift-off layer satisfy the following relational expression (1): the linear expansion coefficient of the lift-off layer <the linear expansion coefficient of the semiconductor substrate . . . (1), and at least one of the forming of the second semiconductor layer or the removing of the second semiconductor layer is performed at a process temperature higher than the processing temperature in the forming of the lift-off layer.

The present invention can easily manufacture a high-performance, back-contact type solar cell.

DETAILED DESCRIPTION

Figure 1:
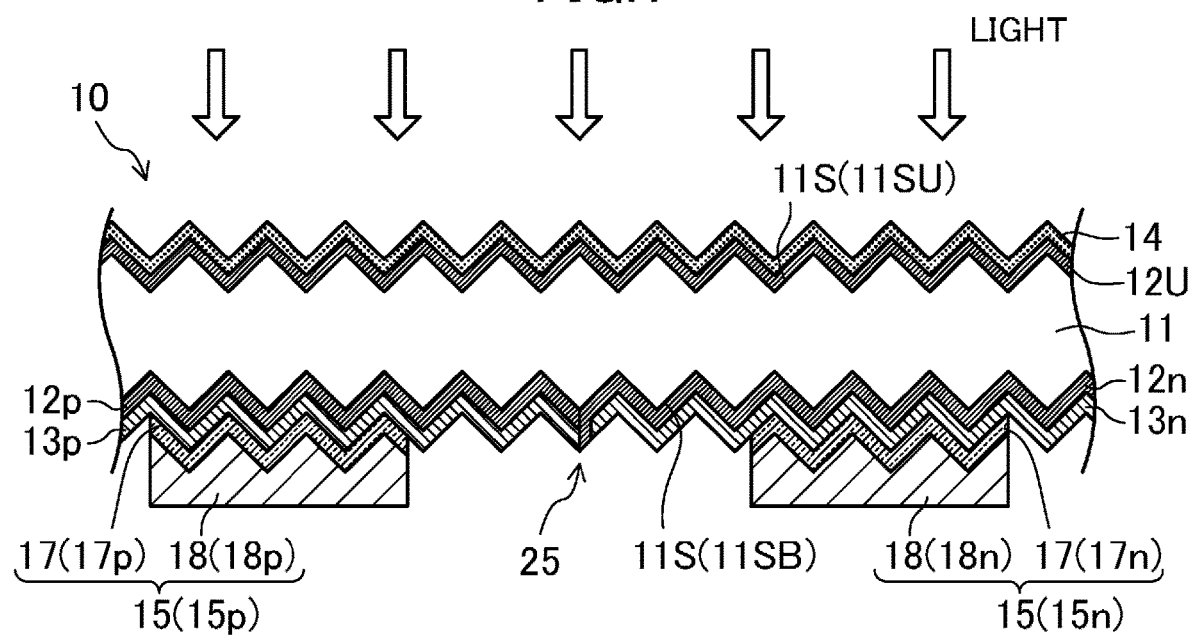
FIG. 1 is a schematic cross-sectional view partially illustrating a solar cell according to an embodiment.

An embodiment of the present disclosure will be described below in detail with reference to the drawings. Note that the embodiment described below is a merely preferred example in nature, and is not intended to limit the applications or use of the present invention. The dimensional ratio of each component in the drawings is shown for the sake of convenience in illustration and is not necessarily the same as the actual one.

First Embodiment

The first embodiment of the present invention will be described with reference to the drawings.

FIG. 1 is a partial cross-sectional view of a solar cell (cell) according to this embodiment. As shown in FIG. 1, a solar cell 10 according to this embodiment uses a crystal substrate 11 made of silicon (Si). The crystal substrate 11 includes two major surfaces 11S (11SU, 11SB) facing each other. The major surface that receives light is referred to as a frontside major surface 11SU, and the opposite major surface is referred to as a backside major surface 11B. For the sake of convenience, the frontside major surface 11SU is described as a light-receiving side made to receive light more actively than the backside major surface 11SB, and the side which is made not to actively receive light is described as the non-light-receiving side.

The solar cell 10 according to this embodiment is a so-called heterojunction crystal silicon solar cell and is of a back-contact type (back-electrode type) in which an electrode layer is disposed on the backside major surface 11SB.

The solar cell 10 includes a crystal substrate 11, an intrinsic semiconductor layer 12, a conductivity type semiconductor layer 13 (a p-type semiconductor layer 13$p$, an n-type semiconductor layer 13$n$), a low reflection layer 14, and an electrode layer 15 (a transparent electrode layer 17, a metal electrode layer 18).

For the sake of convenience, the respective reference characters of members, corresponding to the p-type semiconductor layer 13$p$ and the n-type semiconductor layer 13$n$, may be assigned with the suffixes "p" and "n". The conductivity types are different such as p-type or n-type. Thus, one conductivity type may be referred to as a "first conductivity type" and the other conductivity type may be referred to as a "second conductivity type."

The crystal substrate 11 may be a semiconductor substrate formed of single crystal silicon or polycrystal silicon. Hereinafter, a single crystal silicon substrate will be described as an example.

The crystal substrate 11 may be an n-type single crystal silicon substrate doped with an impurity (e.g., a phosphorus (P) atom) for introducing electrons into silicon atoms or a p-type silicon substrate doped with an impurity (e.g., boron (B) atom) for introducing positive holes into silicon atoms. In the following description, an n-type single crystal substrate supposedly having a long carrier lifetime will be described as an example.

From the viewpoint of confining received light, the two major surfaces 11S of the crystal substrate 11 may have a texture structure TX (first texture structure) formed of mountains (projections) and valleys (depressions). The texture structure TX (uneven surface) can be formed by, for example, anisotropic etching with application of the difference between an etching rate for the (100) plane and that for the (111) plane in the crystal substrate 11.

The thickness of the crystal substrate 11 may be 250 μm or less. The thickness is measured in the direction perpendicular to the average surface of the crystal substrate 11 (which means the surface of an overall substrate not depending on the texture structure TX). Hereinafter, this direction, i.e., the direction in which the thickness is measured, is referred to as the thickness direction.

The size of the texture structure TX can be defined by the number of vertexes (mountains). In the present disclosure, from the viewpoint of light collection and productivity, the number is preferably in the range of 50000 vertexes/mm$^2$ or more to 100000 vertexes/mm$^2$ or less, more preferably 70000 vertexes/mm$^2$ or more to 85000 vertexes/mm$^2$ or less.

If the thickness of the crystal substrate 11 is 250 μm or less, the amount of silicon used is reduced, which makes it easy to secure the silicon substrate and allows a cost reduction. In addition, the back-contact structure for collecting, only on the back surface side, positive holes and electrons generated by photo-excitation within the silicon substrate is suitable from the viewpoint of a free path of each exciton.

An excessively thin crystal substrate 11 causes a reduction in mechanical strength, insufficient absorption of external light (sunlight), and a reduction in short circuit current density. Thus, the thickness of the crystal substrate 11 is preferably 50 μm or more, more preferably 70 μm or more. In the case in which the major surface of the crystal substrate 11 has a texture structure TX, the thickness of the crystal substrate 11 is represented by a distance between straight lines each connecting vertexes of projections in the uneven structure on each of the light-receiving side and the back surface side.

Note that the intrinsic (i-type) semiconductor layer 12 may be formed between the crystal substrate 11 and the conductivity type semiconductor layer 13. The intrinsic semiconductor layer 12 (12U, 12$p$, 12$n$) covers both major surfaces 11S (11SU, 11SB) of the crystal substrate 11, thereby performing surface passivation while avoiding impurities from diffusing into the crystal substrate 11. Note that the "intrinsic (i-type)" semiconductor layer is not limited to a completely intrinsic semiconductor layer containing no conductive impurity, and encompasses a substantially intrinsic layer of "weak n-type" or "weak p-type" containing a trace amount of an n-type impurity or a p-type impurity within the range in which the silicon-based layer can function as an intrinsic layer.

Further, note that the intrinsic semiconductor layer 12 (12U, 12$p$, 12$n$) is not an essential component and may be appropriately formed, as required.

The material for the intrinsic semiconductor layer 12 is not particularly limited, and may be an amorphous silicon-based material or hydrogenated amorphous silicon-based thin layer (a-Si:H thin film) containing silicon and hydrogen, as a thin film. Being amorphous described herein is a structure lacking a long-range order, i.e., encompasses not only a structure having a complete disorder, but also a structure having a short-range order.

The thickness of the intrinsic semiconductor layer 12 is not particularly limited and may be 2 nm or more to 20 nm or less. This is because the intrinsic semiconductor layer 12 having a thickness of 2 nm or more enhances an effect as a passivation layer for the crystal substrate 11, and the one having a thickness of 20 nm or less avoids a decrease in conversion characteristic caused by an increase in resistance.

The intrinsic semiconductor layer 12 can be formed by any method without particular limitations, but may be formed by a plasma enhanced chemical vapor deposition (plasma-enhanced CVD) method. This method allows effective passivation on the surface of the substrate while avoiding impurities from diffusing into single crystal silicon. The plasma-enhanced CVD method also allows formation of an energy gap profile effective for collecting carriers by varying the hydrogen concentration within the intrinsic semiconductor layer 12 along the thickness direction.

Film-forming conditions for a thin film by the plasma-enhanced CVD method may be the substrate temperature of 100° C. or more to 300° C. or less, the pressure of 20 Pa or more to 2600 Pa or less, the high-frequency power density of 0.003 W/cm$^2$ or more to 0.5 W/cm$^2$ or less.

The raw material gas used for the formation of a thin film as the intrinsic semiconductor layer 12 may be a silicon-containing gas such as monosilane (SiH$_4$) or disilane (Si$_2$H$_6$), or a mixed gas of the silicon-containing gas and hydrogen (H$_2$).

The energy gap of the thin film can be changed, as appropriate, by adding, to the raw material gas, a gas containing different species of elements, such as methane (CH$_4$), ammonia (NH$_3$) and monogerman (GeH$_4$) to form a silicon compound such as silicon carbide (SiC), silicon nitride (SiN$_x$), and silicon germanium (SiGe).

The conductivity type semiconductor layer 13 includes a p-type semiconductor layer 13p and an n-type semiconductor layer 13n. As shown in FIG. 1, the p-type semiconductor layer 13p is formed over a part of the backside major surface 11SB of the crystal substrate 11 via the intrinsic semiconductor layer 12p. The n-type semiconductor layer 13n is formed over the other part of the backside major surface of the crystal substrate 11 via the intrinsic semiconductor layer 12n. Specifically, the intrinsic semiconductor layer 12 is interposed, as an intermediate layer for passivation, between the p-type semiconductor layer 13p and the crystal substrate 11 and between the n-type semiconductor layer 13n and the crystal substrate 11.

The thickness of each of the p-type semiconductor layer 13p and the n-type semiconductor layer 13n is not particularly limited and may be 2 nm or more to 20 nm or less. This is because the intrinsic semiconductor layer 12 having a thickness of 2 nm or more enhances an effect as a passivation layer for the crystal substrate 11, and the one having a thickness of 20 nm or less avoids a decrease in conversion characteristic caused by an increase in resistance.

The p-type semiconductor layer 13p and the n-type semiconductor layer 13n are disposed on a backside of the crystal substrate 11 to be electrically disconnected from each other. The thickness of the conductivity type semiconductor layer 13 may be 50 µm or more to 3000 µm or less, preferably 80 µm or more to 500 µm or less. In addition, a distance between the p-type semiconductor layer 13p and the n-type semiconductor layer 13n may be 3000 µm or less, preferably 1000 µm or less (note that the width of the semiconductor layer and the width of the electrode layer, which will be described later, are the lengths of the parts of the respective patterned layers, and, for example, lengths in a direction orthogonal to the direction in which linear parts of the respective layers extend, unless otherwise stated).

If photo excitons (carriers) generated in the crystal substrate 11 are taken out via the conductivity type semiconductor layer 13, the effective mass of the positive holes is larger than that of the electrons. Thus, from the viewpoint of reducing a transport loss, the p-type semiconductor layer 13p may be narrower than the n-type semiconductor layer 13n. For example, the width of the p-type semiconductor layer 13p may be 0.5 times or more to 0.9 times or less, preferably 0.6 times or more to 0.8 times or less that of the n-type semiconductor layer 13n.

The low reflection layer 14 avoids reflection of light received by the solar cell 10. The material for the low reflection layer 14 may be any translucent material which transmits light without particular limitations, and examples thereof include silicon oxide ($SiO_x$), silicon nitride ($SiN_x$), zinc oxide (ZnO), and titanium oxide ($TiO_x$). The low reflection layer 14 may be formed by, for example, application of a resin material containing nanoparticles of oxide such as zinc oxide and titanium oxide, dispersed therein.

The electrode layer 15 is formed to cover each of the p-type semiconductor layer 13p and the n-type semiconductor layer 13n, thereby being electrically connected to the conductivity type semiconductor layer 13. Thus, the electrode layer 15 functions as a transport layer for guiding carriers generated in each of the p-type semiconductor layer 13p and the n-type semiconductor layer 13n.

The electrode layer 15p corresponding to the semiconductor layer 13p and the electrode layer 15n corresponding to the semiconductor 13n are apart from each other so as to avoid a short circuit between the p-type semiconductor layer 13p and the n-type semiconductor layer 13n.

The electrode layer 15 may be formed of only a highly conductive metal. From the viewpoint of electrical junction with each of the p-type semiconductor layer 13p and the n-type semiconductor layer 13n, or from the viewpoint of avoiding atoms of a metal which is an electrode material from diffusing in both of the semiconductor layers 13p and 13n, the electrode layer 15 formed of a transparent conductive oxide may be provided between an electrode layer formed of a metal and a p-type semiconductor layer 13p and between an electrode layer formed of a metal and the n-type semiconductor layer 13n.

Figure 2:
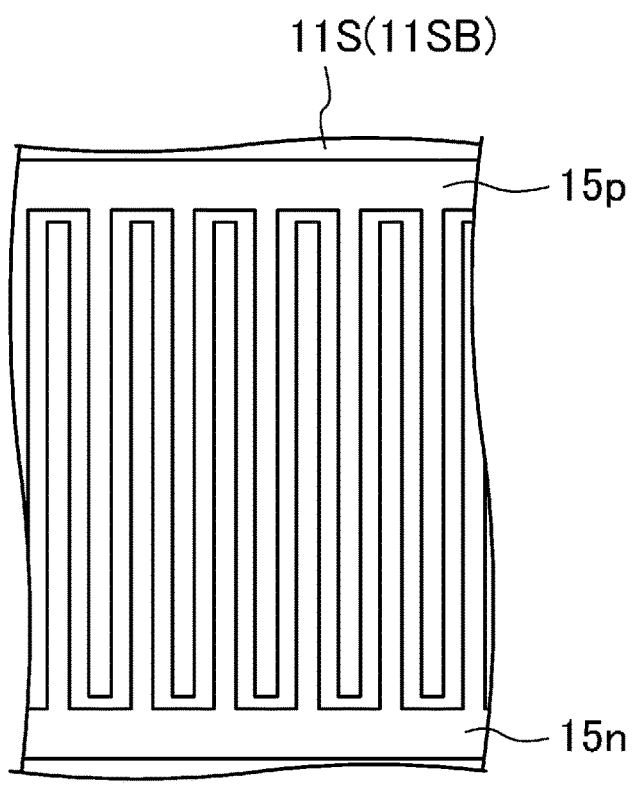
FIG. 2 is a plan view illustrating a backside major surface of a crystal substrate which is a component of a solar cell according to the embodiment.

In this embodiment, the electrode layer 15 formed of a transparent conductive oxide is referred to as a transparent electrode layer 17, and the electrode layer 15 formed of a metal is referred to as a metal electrode layer 18. As shown in the plan view of the backside major surface 11SB of the crystal substrate 11 of FIG. 2, in the p-type semiconductor layer 13p and the n-type semiconductor layer 13n each having a comb-tooth shape, an electrode layer formed on a base portion of the comb is also referred to as a busbar portion, and an electrode layer formed on a teeth portion of the comb is also referred to as a finger portion.

The material for the transparent electrode layer 17 is not particularly limited, and examples thereof include zinc oxide (ZnO), indium oxide ($InO_x$), and transparent conductive oxides obtained by adding, to indium oxide, various metal oxides such as titanium oxide ($TiO_x$), tin oxide (SnOx), tungsten oxide ($WO_x$), and molybdenum oxide ($MoO_x$) at a concentration of 1 wt % or more to 10 wt % or less.

The thickness of the transparent electrode layer 17 may be 20 nm or more to 200 nm or less. A transparent electrode layer suitable for this thickness may be formed by, for example, the physical vapor deposition (PVD) method such as a sputtering method or the metal-organic chemical vapor deposition (MOCVD) method utilizing a reaction of an organic metal compound with oxygen or water.

The material for the metal electrode layer 18 is not particularly limited, and examples thereof include silver (Ag), copper (Cu), aluminium (Al), and nickel (Ni).

The thickness of the metal electrode layer 18 may be 1 µm or more to 80 µm or less. A metal electrode layer 18 having this thickness may be formed suitably by a printing method such as ink-jet printing or screen printing of a material paste or a plating method. However, the present disclosure is not limited thereto, and if a vacuum process is employed, a vapor deposition or sputtering method may be employed.

The width of the teeth portion of the comb in each of the p-type semiconductor layer 13p and the n-type semiconductor layer 13n may be the same as that of the metal electrode layer 18 formed on the teeth portion. Note that the metal electrode layer 18 may be narrower than the teeth portion. With the configuration in which the occurrence of a leakage current between the metal electrode layers 18 is avoided, the metal electrode layer 18 may be wider than the teeth portion.

In this embodiment, a predetermined annealing is performed with the intrinsic semiconductor layers 12, the conductivity type semiconductor layers 13, the low reflection layer 14, and the electrode layers 15 being stacked on the backside major surface 11SB of the crystal substrate 11, to perform passivation at each junction surface, avoid generation of a defect level at the conductivity type semiconductor layer 13 and its interfaces, and crystallize the transparent conductive oxide in the transparent electrode layers 17.

The annealing according to this embodiment may be performed by placing the crystal substrate 11 having the layers formed, in an oven heated at a temperature of 150° C.

or more to 200° C. or less. In this case, the atmosphere in the oven may be atmospheric air, and the annealing can be performed more effectively using hydrogen or nitrogen as the atmosphere. The annealing may be performed also by rapid thermal annealing (RTA) of irradiating the crystal substrate 11 having the formed layers, with infrared light using an infrared heater.

Method for Manufacturing Solar Cell

A method for manufacturing a solar cell 10 according to this embodiment will be described below with reference to FIGS. 3 to 10.

Figure 3:
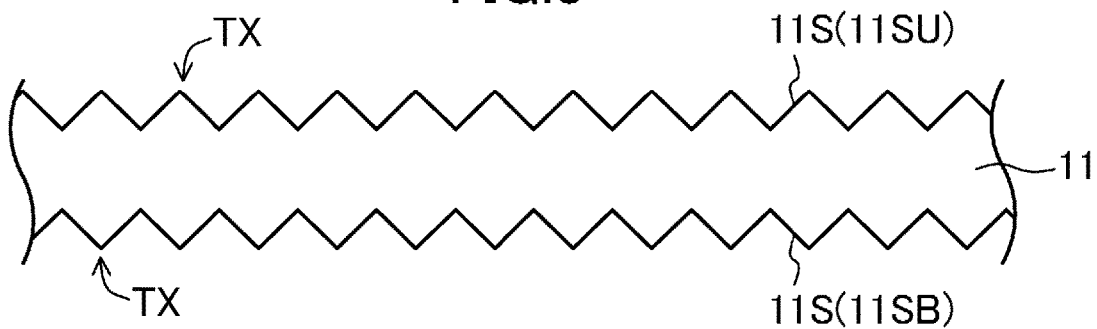
FIG. 3 is a schematic cross-sectional view partially illustrating one step of a method for manufacturing a solar cell according to the embodiment.

First, as shown in FIG. 3, a crystal substrate 11 having a frontside major surface 11SU and a backside major surface 11SB both of which have a texture structure TX is prepared.

Figure 4:
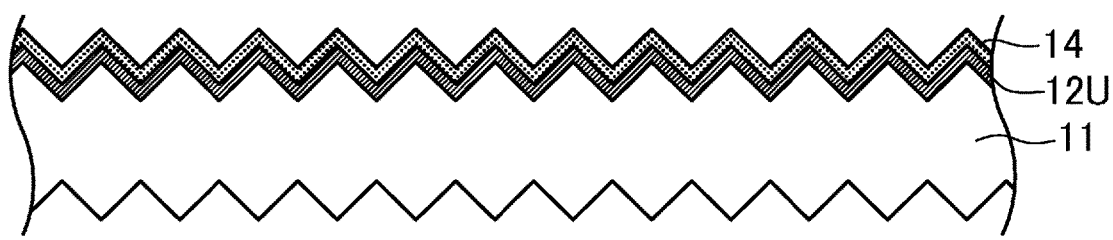
FIG. 4 is a schematic cross-sectional view partially illustrating another step of the method for manufacturing a solar cell according to the embodiment.

Next, as shown in FIG. 4, for example, an intrinsic semiconductor layer 12U is formed on the frontside major surface 11SU of the crystal substrate 11. Subsequently, a low reflection layer 14 is formed on the formed intrinsic semiconductor layer 12U. The low reflection layer 14 uses silicon nitride ($SiN_x$) or silicon oxide ($SiO_x$) having a suitable light absorption coefficient and refractive index from the viewpoint of light confinement effect of confining incident light.

Figure 5:
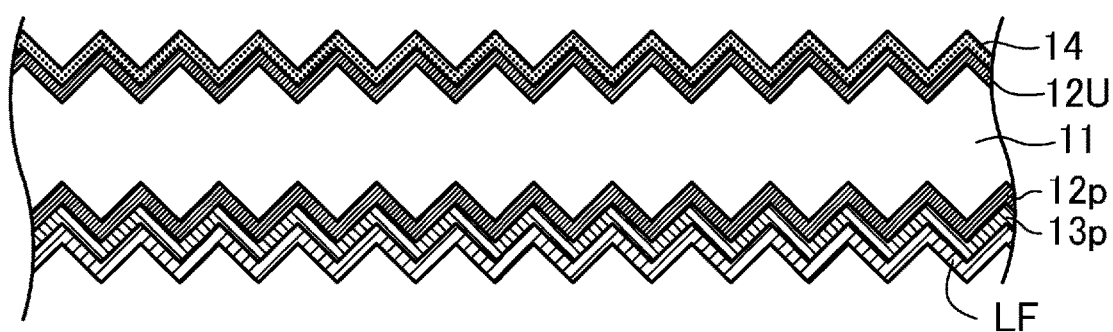
FIG. 5 is a schematic cross-sectional view partially illustrating still another step of the method for manufacturing a solar cell according to the embodiment.

Next, as shown in FIG. 5, a p-type semiconductor layer 13p is formed over the backside major surface 11SB of the crystal substrate 11. In FIG. 5, as mentioned above, an intrinsic semiconductor layer 12p using, for example, i-type amorphous silicon is formed between the crystal substrate 11 and the p-type semiconductor layer 13p. Thus, in this embodiment, the forming of the p-type semiconductor layer (first semiconductor layer) 13p includes forming an intrinsic semiconductor layer (first intrinsic semiconductor layer) 12p on one major surface (backside major surface) 11S of the crystal substrate (semiconductor substrate) 11 prior to the forming of the p-type semiconductor layer 13p.

The p-type semiconductor layer 13p is a silicon layer doped with a p-type dopant (such as boron (B)), and is formed of suitably amorphous silicon from the viewpoint of avoiding impurities from diffusing and reducing series resistance. On the other hand, if the n-type semiconductor layer 13n is used as substitute for the p-type semiconductor layer 13p, the n-type semiconductor layer is a silicon layer doped with an n-type dopant (e.g., phosphorus (P)), and is formed of suitably amorphous silicon just like the p-type semiconductor layer. The raw material gas used for the formation of the conductivity type semiconductor layer 13 may be a silicon-containing gas such as monosilane ($SiH_4$) or disilane ($Si_2H_6$), or a mixed gas of the silicon-containing gas and hydrogen ($H_2$). Diborane ($B_2H_6$) can be used as a dopant gas for the formation of p-type semiconductor layer 13p, and phosphine ($PH_3$) can be used as a dopant gas for the formation of the n-type semiconductor layer. A trace amount of boron (B) or phosphorus (O) is only required to be added as an impurity, and thus, a mixed gas obtained by diluting the dopant gas with the raw material gas may be used.

In order to adjust the energy gap of the p-type semiconductor layer 13p or the n-type semiconductor layer 13n, the p-type semiconductor layer 13p or the n-type semiconductor layer 13n may be formed into a compound by adding a gas containing different kinds of elements, such as methane ($CH_4$), carbon dioxide ($CO_2$), ammonia ($NH_3$), and monogermane ($GeH_4$).

Subsequently, as shown in FIG. 5, a lift-off layer LF is formed on the formed p-type semiconductor layer 13p. This lift-off layer LF is selectively removed by patterning in the step shown in FIG. 6, which will be described later (hereinafter also referred to as the patterning step) and is then removed together with the n-type semiconductor layer 13n in the step shown in FIG. 8. The lift-off layer is removed in the lift-off step shown in FIG. 8. In order to avoid excessive etching of the lift-off layer in the steps before the lift-off step, the etching rate is controlled to satisfy the following relational expressions (2A) and (2B) in one preferred embodiment.

<Patterning Step>

The etching rate for the semiconductor layer 13p of a first conductivity type≤the etching rate for the lift-off layer (2A)

<Lift-Off Step>

The etching rate for the semiconductor layer 13p of a first conductivity type<<the etching rate for the lift-off layer LF (2B)

Specifically, in the patterning step and the lift-off step using an etching solution, it is required to satisfy the etching rate for the semiconductor layer 13p of a first conductivity type≤the etching rate for the lift-off layer LF (2).

Figure 6:
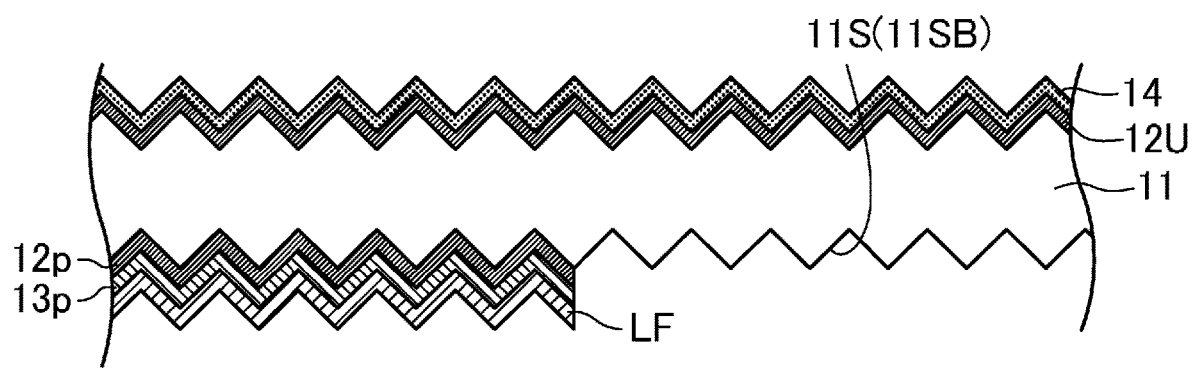
FIG. 6 is a schematic cross-sectional view partially illustrating still another step of the method for manufacturing a solar cell according to the embodiment.
Figure 7:
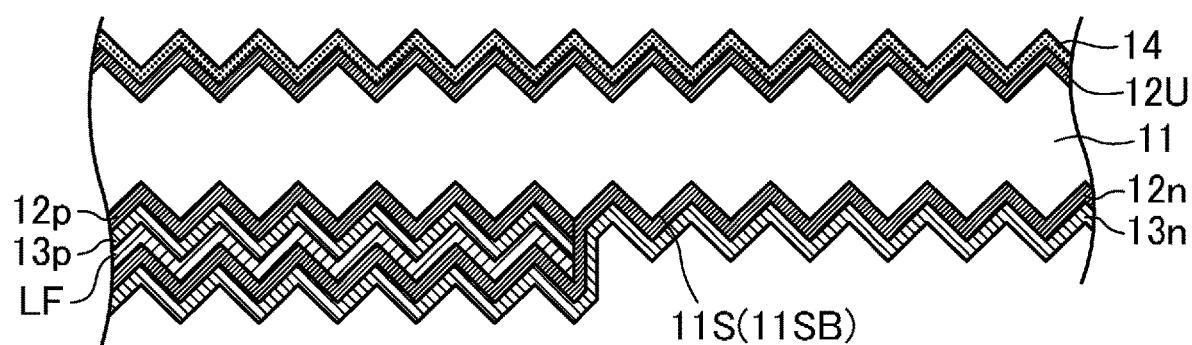
FIG. 7 is a schematic cross-sectional view partially illustrating still another step of the method for manufacturing a solar cell according to the embodiment.
Figure 8:
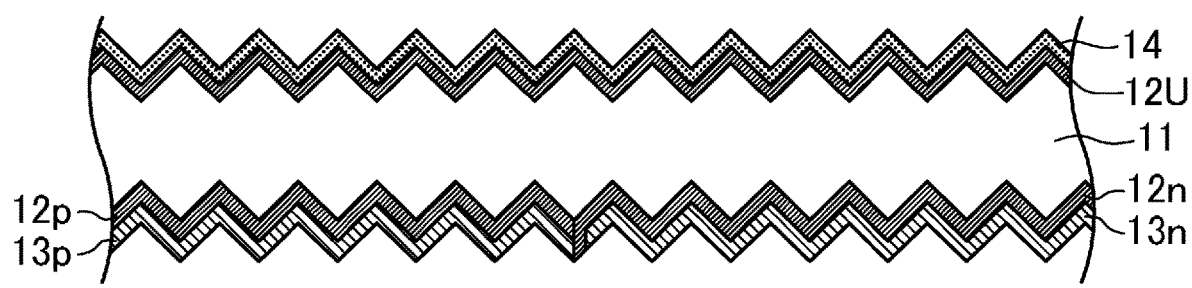
FIG. 8 is a schematic cross-sectional view partially illustrating still another step of the method for manufacturing a solar cell according to the embodiment.
Figure 9:
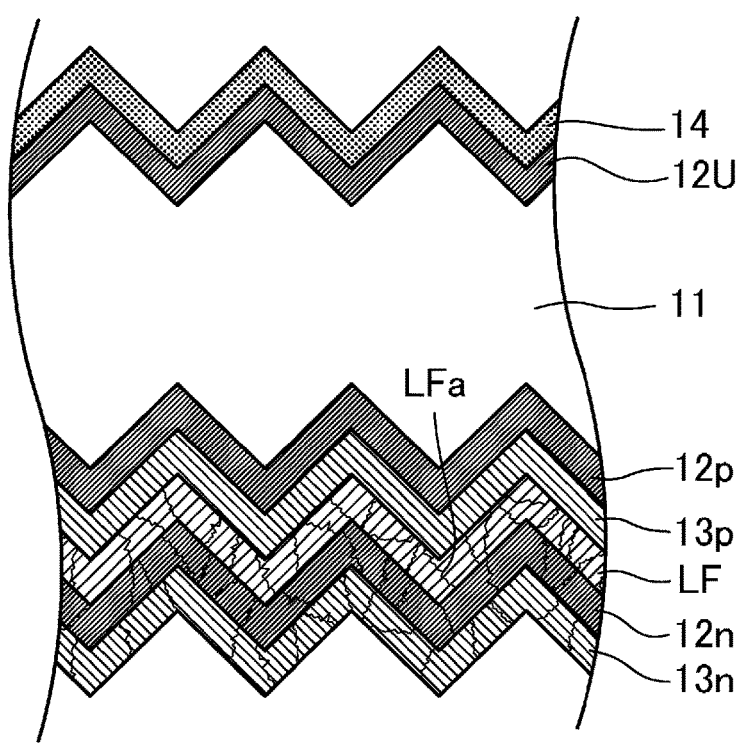
FIG. 9 is a partially enlarged view illustrating the state in which a lift-off layer is cracked in the method for manufacturing a solar cell according to the embodiment.

This is because, since a solution containing hydrofluoric acid as a main component is used as an etching solution in the this embodiment, the lift-off layer LF needs not to be excessively etched in the patterning step shown in FIG. 6, and needs to be sufficiently lifted off (dissolved) in the lift-off step shown in FIG. 8. In order to achieve such etching form, in the step shown in FIG. 7 or a step between the steps shown in FIGS. 7 and 8, a process at a process temperature higher than the process temperature in the step shown in FIG. 5 is performed in one preferred embodiment. For example, if the process temperature in the forming of a lift-off layer shown in FIG. 5 is 150° C., a step of performing a heat treatment at a temperature preferably in the range of 160° C. or more to 190° C. or less, more preferably 170° C. or more to 185° C. or less is performed in one preferred embodiment. If the step is performed at a temperature higher than these temperatures in the ranges, the film quality of the intrinsic semiconductor layer 12, the p-type semiconductor layer 13p, and the n-type semiconductor layer 13n may decrease, and the solar cell characteristic may be deteriorated, which is not preferable. Note that the process temperature is a temperature actually reached by the crystal substrate 11, the intrinsic semiconductor layer 12, the conductivity type semiconductor layer 13, and the lift-off layer LF.

The lift-off layer LF according to this embodiment preferably has a linear expansion coefficient at around 200° C. which is suitably smaller than that of the crystal substrate 11. That is, the linear expansion coefficients of the lift-off layer LF and the crystal substrate 11 suitably satisfy the following relational expression (1).

The linear expansion coefficient of the lift-off layer<the linear expansion coefficient of the crystal substrate 11 (1)

Specifically, these linear expansion coefficients are suitably lower than that of silicon constituting the crystal substrate 11, which is 3.4 ppm/K or more to 3.5 ppm/K or less. Therefore, the lift-off layer LF contains suitably silicon oxide (linear expansion coefficient: 0.5 ppm/K or more to 1.0 ppm/K or less) or silicon nitride (3.1 ppm/K) as a main component. Particularly suitably, the main component is silicon oxide from the viewpoint of the linear expansion coefficient. The linear expansion coefficient of the lift-off layer may be regulated by a composite compound such as silicon oxynitride. Regarding the composition of the lift-off layer LF, assuming that silicon oxide, which is a main component, is represented by $SiO_x$, the composition x is preferably in the range of 0.5 or more to 2.2 or less, more preferably 1.2 or more to 2.0 or less, particularly preferably 1.4 or more to 1.9 or less, but it is important to satisfy the magnitude relationship (relational expression (1)) in any of these compositions X. The upper limit of the composition x is higher than the general stoichiometric value (x=2.0). This is because oxygen may be excessively contained in the thin film forming process of the lift-off layer LF. Assuming that silicon nitride is represented by $SiN_y$, the composition y is preferably in the range of 0.8 or more to 1.4 or less, more preferably 0.9 or more to 1.3 or less.

The thickness of the entire lift-off layer LF may be 20 nm or more to 600 nm or less, particularly preferably 50 nm or more to 450 nm or less. Within the thickness ranges, insufficient etching and reduction in productivity due to too thick lift-off layer and excessive etching in the patterning step shown in FIG. 6 due to too thin lift-off layer can be avoided.

Then, in the selective removing of the p-type semiconductor layer (first semiconductor layer) 13p shown in FIG. 6 (patterning step), the intrinsic semiconductor layer 12p, the p-type semiconductor layer 13p, and the lift-off layer LF formed in the step shown in FIG. 5 are selectively removed by patterning. This patterning step can be performed using a known technique, and can be performed with high accuracy and less damage to the crystal substrate 11 by photolithography, for example. In this embodiment, from the viewpoint of giving priority to the efficiency of light collection, the backside major surface 11SB of the crystal substrate 11 also has a texture structure TX. In this case, it becomes somewhat difficult to perform the patterning step using the laser beam. In the etching of this patterning step, the etching solution can be replaced stepwise. For example, for the etching of the lift-off layer LF, a solution of hydrolyzed hydrofluoric acid can be used, and for the etching of the p-type semiconductor layer 13p, a solution obtained by dissolving ozone in hydrofluoric acid (hereinafter, ozone-hydrofluoric acid solution) can be used.

In the patterning step shown in FIG. 6, the etching is performed up to the intrinsic semiconductor layer 12p, and the crystal substrate 11 is exposed in the patterning region, in one preferred embodiment. In this manner, the reduction in lifetime of carriers generated by photoelectric conversion may be avoided.

In the step shown in FIG. 7, an n-type semiconductor layer 13n is formed. The n-type semiconductor layer 13n is formed over the entire backside major surface 11SB of the crystal substrate 11. Specifically, the n-type semiconductor layer 13n is formed also on the lift-off layer LF. In the same manner as in the step shown in FIG. 5, an intrinsic semiconductor layer 12n is formed between the crystal substrate 11 and the n-type semiconductor layer 13n. In this case, the n-type semiconductor layer 13n is formed not only on the upper surface of the lift-off layer LF, but also over the sides (end surfaces) of the lift-off layer LF, the p-type semiconductor layer 13p, and the intrinsic semiconductor layer 12p via the intrinsic semiconductor layer 12n. Thus, in this embodiment, the forming of the n-type semiconductor layer (second semiconductor layer) 13n includes forming an intrinsic semiconductor layer (second intrinsic semiconductor layer) 12n on and over one major surface (backside major surface) 11S of the crystal substrate (semiconductor substrate) 11 having the lift-off layer LF and the p-type semiconductor layer prior to the forming of the n-type semiconductor layer 13n. Prior to the forming of the intrinsic semiconductor layer 12n, a washing step for washing the surface of the crystal substrate 11 exposed in the patterning step shown in FIG. 6 may be performed. The washing step is intended to remove defects and impurities generated on the surface of the crystal substrate 11 in the patterning step, and for example, the surface may be treated with hydrofluoric acid.

Then, in the lift-off step of removing the n-type semiconductor layer (second semiconductor layer) 13n covering the lift-off layer LF shown in FIG. 8, the lift-off layer, and the intrinsic semiconductor layer 12n and the n-type semiconductor layer 13n formed on or over the lift-off layer LF are collectively removed. The patterning step shown in FIG. 6 uses photolithography, whereas this lift-off step does not require a resist application step and a developing step required in photolithography. Therefore, the n-type semiconductor layer 13n is easily patterned. If a film containing silicon oxide or silicon nitride as a main component is applied to the lift-off layer LF, the etching solution in this step is hydrofluoric acid.

In this embodiment, at least one of the forming of the n-type semiconductor layer shown in FIG. 7 or the lift-off step shown in FIG. 8 suitably includes a step performed at a process temperature higher than the process temperature in the forming of the p-type semiconductor layer shown in FIG. 5. This is because, as shown in the enlarged view of FIG. 9, fine cracks LFa are generated in the lift-off layer LF by utilizing the above-described difference in the linear expansion coefficient. These cracks LFa make the etching solution efficiently enter the lift-off layer LF in the lift-off step shown in FIG. 8. This makes it possible to suitably etch the lift-off layer LF and the n-type semiconductor layer 13n on this lift-off layer LF. The cracks LFa are not required to be generated in the entire lift-off layer LF in the thickness direction, and only required to have a depth which is about equal to or more than a half of the thickness of the lift-off layer LF.

The process performed at a high temperature includes formation of the n-type semiconductor layer 13n in the forming of the n-type semiconductor layer shown in FIG. 7. In addition to this process, a heat treatment step of causing cracks LFa to generate may further be performed. For example, the lift-off layer LF may be subjected to annealing as an initial treatment performed immediately before the lift-off step shown in FIG. 8 or in the lift-off step.

Figure 10:
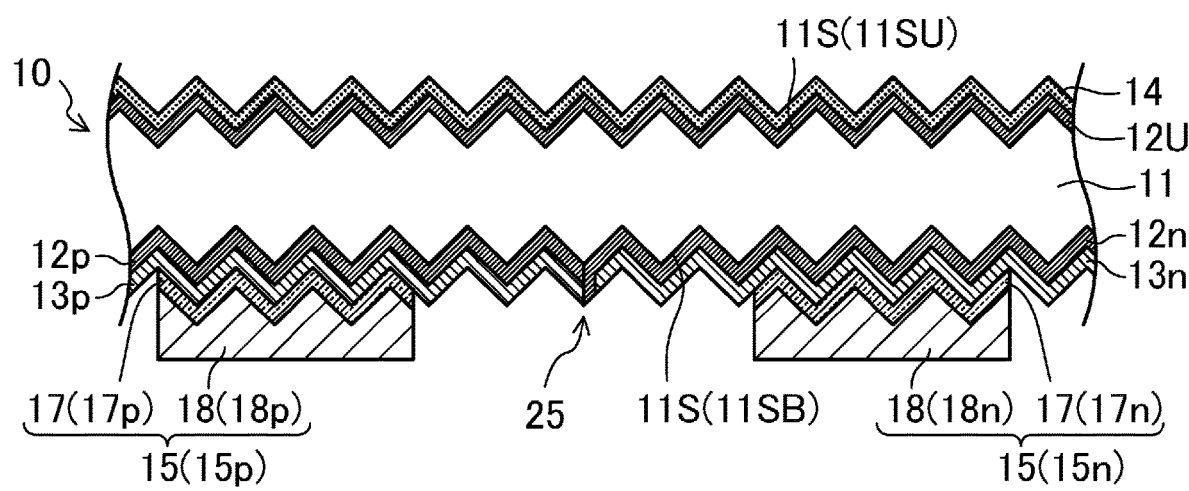
FIG. 10 is a schematic cross-sectional view partially illustrating one step of a method for manufacturing a solar cell according to the embodiment.

Then, as shown in FIG. 10, a transparent electrode layer 17 (17p, 17n) is formed over the backside major surface 11SB of the crystal substrate 11, i.e., on each of the p-type semiconductor layer 13p and the n-type semiconductor layer 13n by sputtering using a mask, to form a separation trench 25. The transparent electrode layer 17 (17p, 17n) may be formed by the following method as a substitute for the sputtering. For example, the transparent electrode layer 17 (17p, 17n) may be formed by forming a transparent conductive oxide film over the entire backside major surface 11SB without a mask and thereafter performing etching by photolithography to leave the transparent conductive oxide film on each of the p-type semiconductor layer 13p and the n-type semiconductor layer 13n. Then, a separation trench 25 for separating and insulating the p-type semiconductor layer 13p and the n-type semiconductor layer 13n from each other is formed. The separation trench 25 makes it difficult for a leakage current to occur.

Thereafter, a linear metal electrode layer 18 (18p, 18n) is formed on the transparent electrode layer 17 by using, for example, a mesh screen (not shown) having an opening.

By the steps described above, the backside junction-type solar cell 10 is formed.

The present disclosure is not limited to the embodiment described above, and various modifications can be made within the scope set out in the claims. In other words, the technical scope of the present disclosure also includes embodiments obtained by combining technical means appropriately modified within the scope set out in the claims.

EXAMPLE

The examples of the present disclosure are described in more detail below. However, the present disclosure is not limited by the examples. Solar cells of examples and comparative examples were produced as follows (see Table 1).

Crystal Substrate

First, as a crystal substrate, a 200-μm-thick single crystal silicon substrate was employed. Both major surfaces of the single crystal silicon substrate were anisotropically etched. Thus, a pyramidal texture structure was formed on the crystal substrate.

Intrinsic Semiconductor Layer

Next, the crystal substrate was introduced into a CVD device to form an intrinsic semiconductor layer (thickness: 8 nm) made of silicon on each of both major surfaces of the crystal substrate introduced. The film-forming conditions for the intrinsic semiconductor layer were the substrate temperature of 150° C., the pressure of 120 Pa, the flow rate ratio $SiH_4/H_2$ of 3/10, and the power density of 0.011 $W/cm^2$.

P-Type Semiconductor Layer (Semiconductor Layer of First Conductivity Type)

Then, the crystal substrate having the respective intrinsic semiconductor layers formed on both major surfaces was introduced into the CVD device to form a p-type hydrogenated amorphous silicon-based thin film (film thickness: 10 nm) on the intrinsic semiconductor layer formed on the backside major surface of the crystal substrate.

The film-forming conditions for the p-type semiconductor layer were the substrate temperature of 150° C., the pressure of 60 Pa, the flow rate ratio $SiH_4/B_2H_6$ of 1/3, and the power density of 0.01 $W/cm^2$. The flow rate of the $B_2H_6$ gas in this example is a flow rate of a diluent gas obtained by diluting $B_2H_6$ with $H_2$ to have a $B_2H_6$ density of 5000 ppm.

Lift-Off Layer

Then, as a first lift-off layer used in Example 1, a film of silicon oxide ($SiO_x$) with a film thickness of 200 nm was formed (on a region which is not shielded by the mask) using a plasma-enhanced CVD device. The substrate temperature was 150° C., the pressure was 0.9 kPa, the flow rate ratio $SiH_4/CO_2/H_2$ was 1/10/750, and the power density was 0.15 $W/cm^2$.

Then, as a second lift-off layer used in Example 2, a film of silicon nitride ($SiN_x$) with a film thickness of 200 nm was formed (on a region which is not shielded by the mask) using a plasma-enhanced CVD device. The substrate temperature was 150° C., the pressure was 0.2 kPa, the flow rate ratio $SiH_4/NH_3/H_2$ was 1/4/50, and the power density was 0.15 $W/cm^2$.

Patterning of Lift-Off Layer and P-Type Semiconductor Layer

Then, a photosensitive resist film was formed over the backside major surface having the formed p-type semiconductor layer or both major surfaces of the crystal substrate. The formed photosensitive resist film was exposed to light and developed by photolithography, thereby exposing an etching region of the p-type semiconductor layer. In this patterning, first, the crystal substrate having an exposed etching region was immersed in 1 wt % hydrofluoric acid, thereby removing a lift-off layer in the etching region. Subsequently, the crystal substrate was rinsed with pure water, then immersed in ozone-hydrofluoric acid obtained by mixing 20 ppm ozone and 5.5 wt % hydrofluoric acid, thereby removing the p-type semiconductor layer and the intrinsic semiconductor layer in the etching region. Hereinafter, this step is referred to as a p-type semiconductor layer patterning step.

N-Type Semiconductor Layer (Semiconductor Layer of Second Conductivity Type)

After the p-type semiconductor layer patterning step, the exposed area of the backside major surface was washed with 2 wt % hydrofluoric acid, and the crystal substrate washed was introduced into the CVD device to form an intrinsic semiconductor layer and an n-type hydrogenated amorphous silicon-based thin layer (film thickness: 10 nm) on the backside major surface.

The film-forming conditions for the n-type semiconductor layer were the substrate temperature of 150° C. or 180° C., the pressure of 60 Pa, the flow rate ratio $SiH_4/PH_3$ of 1/2, and the power density of 0.01 $W/cm^2$. The flow rate of the $PH_3$ gas in this example is a flow rate of a diluent gas obtained by diluting $PH_3$ with $H_2$ to have a $PH_3$ density of 5000 ppm.

Annealing for Causing Cracks in Lift-Off Layer

Next, the crystal substrate having the formed n-type semiconductor layer thereon was subjected to annealing in an oven at a temperature of 180° C. for 20 minutes under atmospheric conditions. The annealing target herein was mainly the lift-off layer. By the annealing, cracks necessary for the lift-off layer were formed.

Removal (Lift Off) of Lift-Off Layer and N-Type Semiconductor Layer

Then, the annealed crystal substrate having the formed n-type semiconductor layer was immersed in 5 wt % hydrofluoric acid. Thus, the lift-off layer, the n-type semiconductor layer covering the lift-off layer, and the intrinsic semiconductor layer interposed between the lift-off layer and the n-type semiconductor layer were collectively removed.

Electrode Layer

Then, using a magnetron sputtering device, an oxide film (film thickness: 100 nm) which was a basis of transparent electrode layers was formed on the conductivity type semiconductor layer over the crystal substrate. As a target of a transparent conductive oxide, indium oxide (ITO) containing 10 wt % tin oxide was used. A mixed gas of argon (Ar) and oxygen ($O_2$) was introduced into a chamber of the sputtering device, and the pressure in the chamber was set at 0.6 Pa. A mixing ratio between argon and oxygen was set such that the low refractive index layer had the lowest (bottom) refractive index. Further, the film formation was performed using a DC power source at a power density of 0.4 $W/cm^2$.

Then, etching was performed by photolithography such that the transparent conductive oxide film on the p-type semiconductor layer and the n-type semiconductor layer only remain. Thus, transparent electrode layers were formed. By the transparent electrode layers formed by this etching, conduction between a transparent conductive oxide film on the p-type semiconductor layer and a transparent conductive oxide film on the n-type semiconductor layer is inhibited.

A silver paste (DOTITE FA-333 manufactured by FUJIKURA KASEI CO., LTD.) without dilution was screen-printed on the transparent electrode layers, which were then subjected to a heat treatment at 150° C. for 60 mins. Thus, metal electrode layers were formed.

The evaluation methods for the back-contact type solar cells will be described below. See Table 1 for evaluation results.

Evaluation of Film Thickness and Etching State

The film thickness and etching state of the lift-off layer were evaluated using a field-emission scanning electron microscope (SEM) (S4800 manufactured by Hitachi High-Tech Corporation) at a magnification of 100000. After the p-type semiconductor layer patterning step, the state in which the lift-off layer was etched according to the patterned removal area in design was evaluated as "◯", and the state in which the lift-off layer was excessively etched was evaluated as "x."

In the lift-off step, the state in which the lift-off layer was removed was evaluated as "◯", and the state in which the lift-off layer remains was evaluated as "x". In Comparative Example 2, the lift-off layer was removed in the p-type semiconductor layer patterning step. Thus, the evaluation for the steps subsequent to the lift-off step was not available, which was therefore indicated by "-".

Evaluation of Conversion Efficiency

Each of the solar cells was irradiated with reference sunlight of an air mass (AM) 1.5 at a light amount of 100 mW/cm$^2$, and the conversion efficiency (Eff (%)) of the solar cell was measured. The conversion efficiency (solar cell characteristic) of Example 1 was set to 1.00, and the relative value thereto was listed in Table 1.

In Example 1 and Comparative Example 1, silicon oxide was used as the lift-off layer. In Example 2, silicon nitride was used as the lift-off layer.

In Comparative Example 2, a lift-off layer of amorphous silicon with a thickness of 200 nm was formed under the same conditions as for the intrinsic semiconductor layer, and in the p-type semiconductor layer patterning step, etching was performed using ozone-hydrofluoric acid (5.5 wt %) in the same manner as in the other examples and comparative examples. In the lift-off step, ozone-hydrofluoric acid (2 wt %) was used.

TABLE 1

| | Lift-Off Layer | p-type Semiconductor Layer Patterning Step | Annealing | Lift-Off Step | Solar Cell Characteristic |
|---|---|---|---|---|---|
| Ex. 1 | Silicon Oxide | ◯ | Annealed | ◯ | 1.00 |
| Ex. 2 | Silicon Oxide | ◯ | Annealed | ◯ | 0.98 |
| Comp. Ex. 1 | Silicon Oxide | ◯ | Not-annealed | x | 0.32 |
| Comp. Ex. 2 | Amorphous Silicon | x | Annealed | | 0.40 |

Comparing the examples and the comparative example, it was found that the lifting off in the lift-off step could be suitably performed by annealing the lift-off layer before the lift-off treatment. In addition, in Example 1, Example 2, and Comparative Example 2, silicon oxide or silicon nitride having a linear expansion coefficient smaller than that of the crystal substrate was used (see the relational expression (1) described above). This makes it possible to cause cracks in the lift-off layer by the annealing, and thus, it is considered that the cracks have a positive impact on the lifting off.

In contrast, in Comparative Example 2, in the removing of the lift-off layer of amorphous silicon, the n-type semiconductor layer and the intrinsic semiconductor layer were preferentially etched, so that the resultant could not function as a solar cell. Further, no crack was generated in the lift-off layer. This is considered to be due to the fact that the linear expansion coefficients of the crystal substrate and amorphous silicon are close to each other.

The invention claimed is:

1. A method for manufacturing a solar cell, the method comprising:

forming a first semiconductor layer of a first conductivity type on one of two major surfaces of a semiconductor substrate, the two major surfaces facing each other;

forming a first lift-off layer containing a silicon-based thin film material on the first semiconductor layer;

selectively removing the first lift-off layer and the first semiconductor layer;

forming a second semiconductor layer of a second conductivity type on the one major surface having the first lift-off layer and the first semiconductor layer; and removing the second semiconductor layer covering the first lift-off layer by removing the first lift-off layer using an etching solution, wherein linear expansion coefficients of the semiconductor substrate and the first lift-off layer satisfy the following relational expression (1):

the linear expansion coefficient of the first lift-off layer<the linear expansion coefficient of the semiconductor substrate . . . (1), and at least one of the forming of the second semiconductor layer or the removing of the second semiconductor layer is performed at a processing temperature higher than a processing temperature in the forming of first the lift-off layer, wherein the forming of the first semiconductor layer includes forming a first intrinsic semiconductor layer on the one major surface of the semiconductor substrate prior to the forming of the first semiconductor layer, the selective removing of the first semiconductor layer includes selectively removing the first semiconductor layer and then the first intrinsic semiconductor layer, the forming of the second semiconductor layer includes forming a second intrinsic semiconductor layer on the one major surface of the semiconductor substrate prior to the forming of the second semiconductor layer, the one major surface having a second lift-off layer, the first lift-off layer, and the first semiconductor layer, and the removing of the second semiconductor layer includes selectively removing the second semiconductor layer and then the second intrinsic semiconductor layer.

2. The method of claim 1, wherein the first lift-off layer contains silicon oxide as a main component, and in the selective removing of the first lift-off layer and the first semiconductor layer and the removing of the second semiconductor layer covering the first lift-off layer by removing the first lift-off layer using the etching solution, an etching rate for the first semiconductor layer and an etching rate for the first lift-off layer satisfy the following relational expression (2):

the etching rate for the first semiconductor layer≤the etching rate for the first lift-off layer . . . (2).

3. The method of claim 1, wherein
a surface of the semiconductor substrate at least having the first semiconductor layer and the second semiconductor layer has a texture structure.

\* \* \* \* \*